United States Patent [19]
Akram et al.

[11] Patent Number: 6,165,817
[45] Date of Patent: Dec. 26, 2000

[54] METHOD OF BONDING A FLEXIBLE POLYMER TAPE TO A SUBSTRATE TO REDUCE STRESSES ON THE ELECTRICAL CONNECTIONS

[75] Inventors: Salman Akram, Boise; Warren M. Farnworth, Nampa, both of Id.

[73] Assignee: Micron Technology, Inc., Boise, Id.

[21] Appl. No.: 09/398,213

[22] Filed: Sep. 17, 1999

Related U.S. Application Data

[62] Division of application No. 09/049,939, Mar. 30, 1998, Pat. No. 6,028,365.

[51] Int. Cl.[7] .................................................. H01L 21/48
[52] U.S. Cl. ...................... 438/118; 438/119; 438/123; 438/124; 438/127; 438/612; 438/613
[58] Field of Search ............................ 257/685, 686, 257/692, 696, 723, 725, 777, 787; 438/108, 109, 110, 118, 119, 122, 106, 123, 124, 126, 127, 612, 613

[56] References Cited

U.S. PATENT DOCUMENTS

| | | | |
|---|---|---|---|
| 5,133,495 | 7/1992 | Angulas et al. ................... 228/180.1 |
| 5,148,266 | 9/1992 | Khandros et al. ...................... 257/773 |
| 5,229,916 | 7/1993 | Frankeny et al. ...................... 361/386 |
| 5,281,852 | 1/1994 | Normington ............................ 257/685 |
| 5,394,303 | 2/1995 | Yamaji ..................................... 361/749 |
| 5,397,916 | 3/1995 | Normington ............................ 257/686 |
| 5,679,977 | 10/1997 | Khandros et al. ...................... 257/692 |
| 5,682,061 | 10/1997 | Khandros et al. ...................... 257/666 |
| 5,714,405 | 2/1998 | Tsubosaki et al. ...................... 438/118 |
| 5,776,797 | 7/1998 | Nicewarner, Jr. et al. ............. 438/107 |
| 5,801,446 | 9/1998 | DiStefano et al. ...................... 257/778 |
| 5,852,326 | 12/1998 | Khandros et al. ...................... 257/692 |
| 5,885,849 | 3/1999 | DiStefano et al. ...................... 438/108 |
| 5,895,970 | 4/1999 | Miyoshi ................................... 257/696 |
| 6,028,365 | 2/2000 | Akram et al. ............................ 257/778 |

*Primary Examiner*—Olik Chaudhuri
*Assistant Examiner*—Alonzo Chambliss
*Attorney, Agent, or Firm*—Dickstein Shapiro Morin & Oshinsky, LLP

[57] ABSTRACT

The present invention is directed to a semiconductor package and its method of manufacture. Conductors mounted on a flexible polymer tape are used to connect a semiconductor chip to a substrate. The flexible polymer tape can be folded back under the chip to reduce the size necessary for mounting the assembly to almost that of the chip itself. The polymer tape also provides flexibility to reduce stresses on the electrically connections caused by thermal expansion and compression. Additionally, the present invention allows for the stacking of semiconductor chips on top of one another, reducing signal propagation delays between them.

7 Claims, 6 Drawing Sheets

METHOD OF BONDING A FLEXIBLE POLYMER TAPE TO A SUBSTRATE TO REDUCE STRESSES ON THE ELECTRICAL CONNECTIONS

This application is a divisional application of application Ser. No. 09/049,939 filed on Mar. 30, 1998, now U.S. Pat. No. 6,028,365, which is hereby incorporated by reference.

FIELD OF THE INVENTION

The present invention relates to an integrated circuit package, and more particularly to an integrated circuit package provided with a film based interconnect to allow external connections and to a method for its fabrication.

BACKGROUND OF THE INVENTION

Semiconductor devices are widely used in various types of electronic products, consumer products, printed circuit cards, and the like. In an integrated circuit, a number of active semiconductor devices are formed on a chip ("die") of silicon and the chip circuit is interconnected to package leads to form a complete circuit. The size and cost of the semiconductor devices are important features in many of these applications. Any reduction in the cost of producing the package or reduction in the size of the package can provide a significant commercial advantage.

The integrated circuit chips are mounted on substrates which physically support them and provide electrical interconnections with other circuitry. The interconnections between the chip itself and the supporting substrate is known as "first level" assembly or chip interconnection, while the interconnection between the substrate and other circuitry is referred to as "second level" interconnection.

One type of first level interconnection commonly used is the tape automated bonding (TAB) technique. Utilizing this technique, a polymer tape is provided with thin layers of metallic material forming conductors on one surface. These conductors are arranged generally in a ring-like pattern and extend generally radially, towards and away from the center of the ring-like pattern. A semiconductor chip is placed on the tape face down, with the contacts of the chip aligning with the conductors on the tape. The contacts on the chip are electrically bonded to the conductors on the tape. Due to the flexibility of the tape, the structure is not subject to stresses on the connections caused by differing coefficients of thermal expansion. However, because the leads utilized in tape automated bonding extend radially outward in a fan out pattern from the chip, the entire assembly is necessarily much larger than the chip itself, requiring additional space for mounting.

Another type of first level interconnection commonly used is the "flip-chip" bonding technique. Utilizing this technique, the bond pads on the top side of semiconductor chip or die are provided with conductive solder balls. The number and arrangement of the conductive solder balls depends on the circuit requirements, including input/output (I/O), power and ground connections. Advanced chips capable of performing numerous functions may require hundreds or even thousands of I/O connections on a single chip.

The substrate is provided with a series of metal traces on its top surface, each of which terminates with a contact pad. The contact pads are arranged in an array corresponding to the array of solder balls on the top of the chip. The chip is then inverted so that its top side faces toward the top surface of the substrate and its solder balls are in direct physical contact with the corresponding contact pads of the substrate. The solder balls are liquefied by applying heat and pressure through the chip, thereby establishing a direct metallurgical bond between the chip's bond pads and the substrate's contact pads.

The use of the flip-chip technique provided a compact assembly, since the area of the substrate occupied by the contact pads is approximately the same size as the chip itself. Additionally, by utilizing substantially the entire top side of the chip for the bond pads, flip-chip bonding is well suited to use the chips having large numbers of I/O contacts. However, one disadvantage of the flip-chip technique is the substantial stress placed on the first level interconnection structures connecting a chip to a substrate caused by thermal cycling as temperatures within the device fluctuate during operation.

As electrical power is dissipated within the chip, heat is generated which causes the temperature of the chip and substrate to fluctuate as the device is turned on and off. This thermal cycling causes the chip and substrate to expand and contract in accordance with their respective coefficients of thermal expansion (CTE). The coefficient of thermal expansion typically varies for materials of differing composition; thus, the chip and substrate, normally formed of different materials, will expand and contract at different rates and by different amounts. The expansion and contraction can cause the bond pads on the chip to move relative to the contact pads on the substrate. This relative movement places the electrical interconnections under mechanical stress. The repeated application of this stress can result in the breaking of the electrical interconnections, thereby causing the device to malfunction.

Even if the chip and substrate are formed of like materials having similar coefficients of thermal expansion, thermal cycling stresses may still occur because the temperature of the chip may increase more rapidly than the temperature of the substrate when power is first applied to the chip.

Thus, due to the mismatch between the coefficients of thermal expansion of the chip and of the substrate or the disparate heating of the chip and substrate, the temperature range within which the packaged integrated circuit can be used without the reliability of the circuit being impaired due to differential thermal expansion is quite small.

The size of the chip and substrate assembly are also important features. It is frequently desired that several chips be mounted on a single substrate, since there is a need to interconnect a large number of integrated circuits together to provide a complete system.

For example, an exemplary computer system includes one or more processing elements (e.g. microprocessors), a plurality of memory circuits, controller circuits, etc. These circuits are typically packaged in carriers, which are typically interconnected on printed circuit boards. The space required for the package material and the space required for the interconnection wiring between the integrated circuit occupies a substantial portion of the printed circuit board space, which influences the size of the overall electronic device. Furthermore, the required distance between each chip and other chips is determined by the size of each assembly. Delays in propagation of electric signals between the chips are directly related to these distances. Propagation delays limit the speed of the operation of the device. Thus, smaller distances between the chips corresponds to smaller propagation delays and permits taster operation of the device.

The present invention has been designed to address the needs of the electronics industry and to overcome some of the limitations associated with the compact packaging of integrated circuits.

SUMMARY OF THE INVENTION

The present invention advantageously provides a compact integrated circuit package which is mounted to a substrate via a film base tape or interconnect, thus reducing concerns related to stresses cause by differing coefficients of thermal expansion, and a method for making the same.

In one embodiment, a semiconductor die is provided with bond pads on one surface. A flexible polymer tape or interconnect, having thin layers of metallic material forming conductors on one side, is secured to the die. The conductors are bonded to the bond pads of the die through openings in the flexible tape. The flexible tape or interconnect is folded back underneath the bottom of the die. The conductors of the flexible tape, now facing downwards, are connected to the next level of interconnect such as a printed wiring board or the like.

In another embodiment, two semiconductor die are provided having bond pads, on only one edge of a first side. A flexible polymer tape or interconnect, having thin layers of metallic material forming conductors on one side, is secured to each die. Each assembly is secured to opposing sides of the top surface of a support. The support is placed on top of a second support, which may or may not have heatsink properties, and each piece of flexible polymer tape is folded back underneath the second support, causing the conductors to face downward. The flexible polymer tape may be secured to the second support using a dielectric adhesive. The assembly can be encapsulated or injection molded for protection. The assembly can also be covered by a protective cap layer. The conductive traces of the flexible tape, now facing downward, can be connected to the next level interconnect such as a printed wiring board or the like.

In another embodiment, a semiconductor die is provided with bonds pads on a first surface. A plurality of pieces of flexible polymer tape or interconnect, having thin layers of metallic material forming conductors on one side which terminate in terminal pads corresponding to the bond pads of the semiconductor die, are bonded to opposing sides of the first surface of the semiconductor die. The assembly is mounted to a support material, which may or may not have heatsink properties, by securing the bottom surfaces of the flexible tape to the top surface of the support material utilizing a dielectric adhesive. The flexible tape is folded back underneath the support material and secured with dielectric adhesive. The conductive traces of the flexible tape, now facing downward, are connected to the next level interconnect such as a printed wiring board or the like.

In yet a further embodiment, a multiple level package comprising a plurality of dies can be constructed by stacking multiple packages of the type described in the previous embodiment. The conductive traces of the flexible tape or interconnect of one package are connected to the conductive traces of a second package by stacking one package on top of another. The conductive traces of the bottom-most package are connected to the next level interconnect such as a printed wiring board or the like.

Thus, in one aspect the invention provides a semiconductor die which can be mounted to a substrate with reduced stresses on the interconnections created by differing coefficients of thermal expansion.

In yet another aspect of the invention provides a compact semiconductor package with minimal distance between two or more interconnected semiconductor die.

In yet another aspect the invention provides a compact semiconductor package with reduced stress on interconnect connections caused by differing coefficients of thermal expansion.

In yet another aspect the invention provides a method for mounting a semiconductor die which reduces the stresses applied to the mounting connections caused by differing coefficients of thermal expansion.

In yet another aspect the invention provides a method for manufacturing a compact semiconductor die package.

The above and other advantages and features of the invention will become more readily apparent from the following detailed description of the invention which is provided in connection with the accompanying drawings.

DETAILED DESCRIPTION OF PREFERRED EMBODIMENTS

Figure 1A:
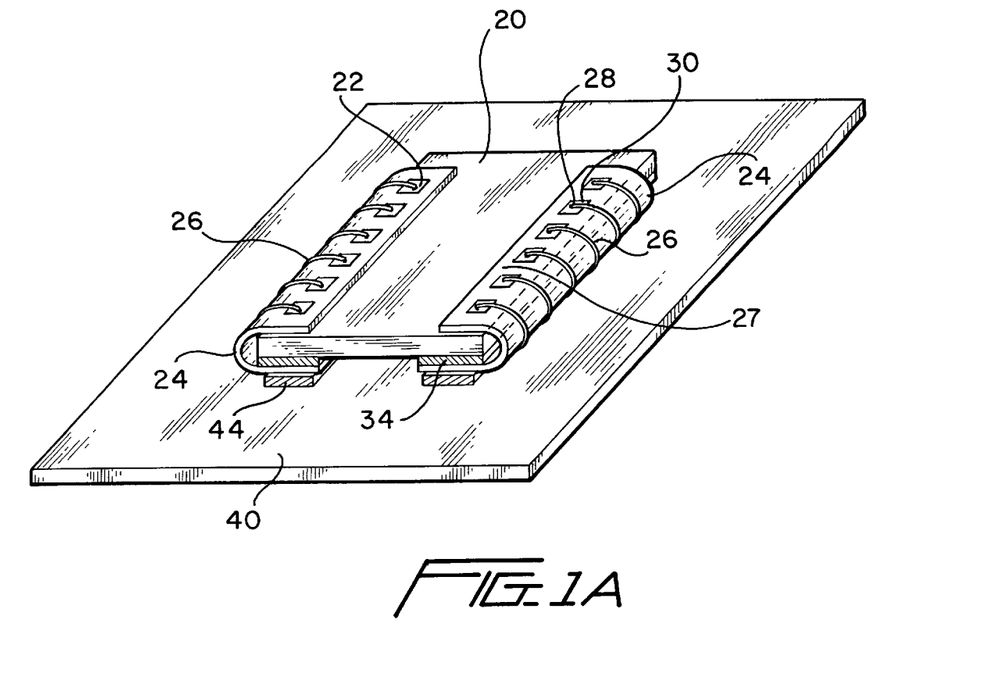
FIG. 1A illustrates a diagrammatic view of a semiconductor die mounted in accordance with a first embodiment of the present invention.

A first embodiment according to the present invention is illustrated diagrammatically in FIG. 1A. A cross-sectional view of the semiconductor package illustrated in FIG. 1A is provided in FIG. 1B.

Figure 1B:
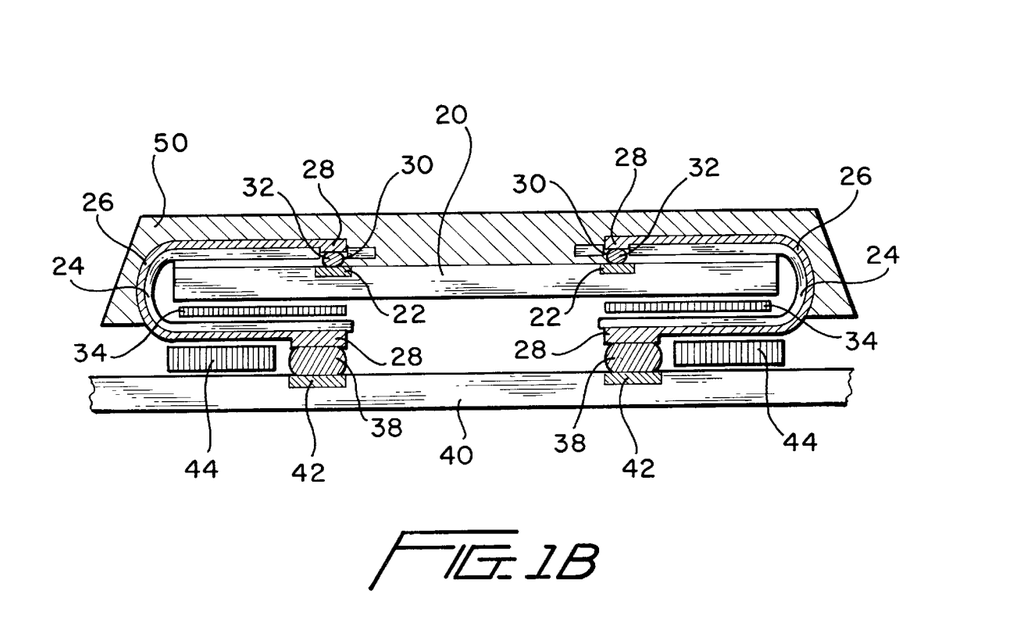
FIG. 1B illustrates a cross-sectional diagrammatic view of a semiconductor die mounted in accordance with the first embodiment of the present invention.

A semiconductor die or chip 20 is provided with a plurality of bonding or bond pads 22 on a first surface. The number and arrangement of the bond pads 22 depends on the circuit requirements of the chip 20, including input/output (I/O), power and ground connections. The bond pads may be provided in a single row on opposing sides of the top surface of chip 20 as illustrated, or alternatively may be provided in a plurality of rows on opposing sides or in a row on just one side, or some other suitable arrangement.

Figure 1C:
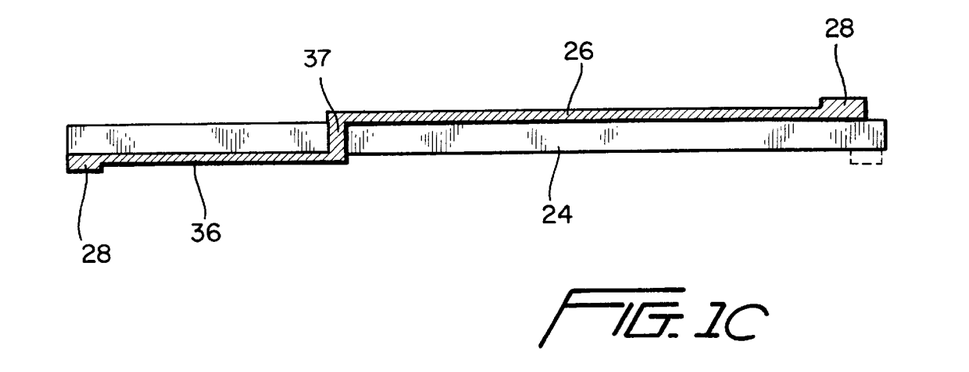
FIG. 1C illustrates a cross-sectional view of an alternate construction for the flexible polymer tape or interconnect.
Figure 1D:
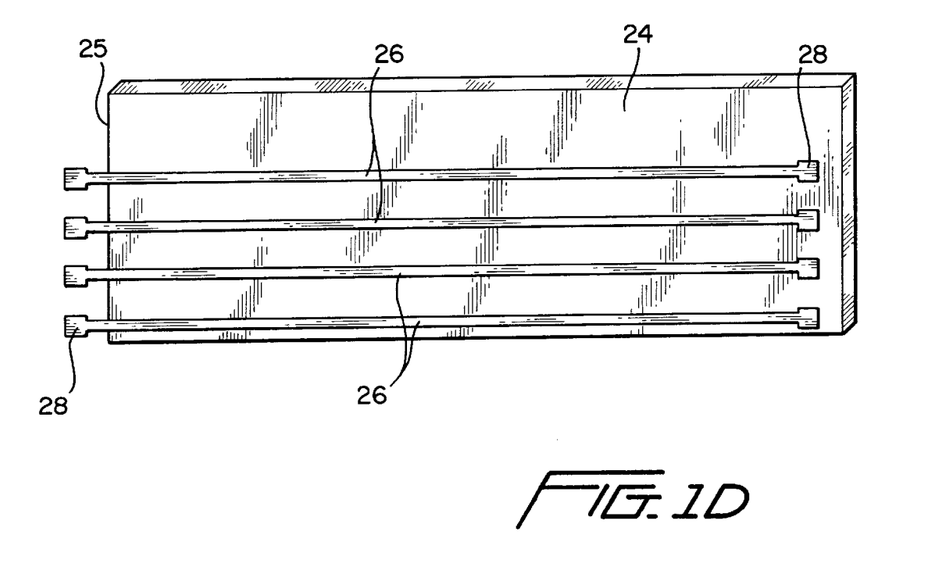
FIG. 1D illustrates a top view of another alternate construction for the flexible polymer tape or interconnect.

A polymer tape or flexible interconnect 24 is used to electrically connect the chip 20 with a substrate 40. Polymer tape 24 is provided with a plurality of thin layers of metallic material forming conductors 26 on one of its surfaces. Polymer tape 24 is generally in the thickness range of 2–6 mils, but is preferably closer to 2 mils to provide a good degree of flexibility. Conductors 26 terminate at each end in conductive ball pads or contacts 28 (FIGS. 1B, 1C, and 1D). Polymer tape 24 is also provided with a plurality of apertures 30 extending through polymer tape 24 at the point where each conductor 26 terminates in a ball pad 28 on the end of the polymer tape 24 that is to be secured to the first surface of chip 20. Apertures 30 must be large enough to allow electrical connection of ball pads 28 and bond pads 22. The apertures 30 and ball pads 28 correspond in number and location to the bond pads 22 of chip 20.

The bond pads 22 of chip 20 are provided with conductive solder balls 32, or alternatively ball pads 28 may be provided with conductive solder balls 32. The bond pads 22 of chip 20 are electrically connected to the ball pads 28 of conductors 26 through opening 30 by solder balls 32 utilizing a standard reflow process.

Alternatively, the bond pads 22 of chip 30 may be electrically connected to the ball pads 28 of conductors 26 utilizing an isotropic or anisotropic conductive polymer bonding technique or a tab compression bond technique as are known in the art.

In an alternate construction for the flexible interconnect or polymer tape 24 as illustrated in FIG. 1C, polymer tape 24 is provided with a plurality of thin layers of metallic material on both sides forming top conductors 26 and bottom conductors 36. The top conductors 26 and bottom conductors 36 terminate in ball pads or contacts 28. The top conductors 26 and bottom conductors 36 are connected electrically by vias or through holes 37 in polymer tape 24. The bottom conductive traces 36 are connected to the bond pads 22 of chip 20 by conductive solder balls 32 (FIG. 1B), which may be provided on either bond pads 22 of chip 20 or ball pads 28.

Alternatively, the bond pads 22 of chip 20 may be electrically connected to the ball pad 28 of conductors 26 utilizing an isotropic or anisotropic conductive polymer bonding technique or a tab compression bond technique as are known in the art.

Signals from the bond pads 22 are conducted by bottom conductors 36 to the top conductors 26 by the vias or through holes 37. Utilizing this construction, apertures 30 in polymer tape 24 are not necessary to provide a connection between top conductors 36 and bond pads 22 of chip 20.

In yet another alternative construction for polymer tape 24 as illustrated in FIG. 1D, polymer tape 24 is provided with a plurality of thin layers of metallic material forming conductive traces 26 on the top side. The conductive traces 26 extend beyond a first edge 25 of the polymer tape 24 and terminate in ball pads 28. Ball pads 28 are aligned to physically correspond to respective bond pads 22 of chip 20. The ball pads 28 are electrically connected to bond pads 22 of chip 20 by conductive solder balls 32, which may be provided on ball pads 28 or alternatively on bond pads 22 of chip 20.

Alternatively, the bond pads 22 of chip 20 may be electrically connected to the ball pads 28 of conductors 26 utilizing an isotropic or anisotropic conductive polymer bonding technique or a tab compression bond technique as are known in the art.

Once the conductors 26 of polymer tape 24 have been electrically connected to bond pads 22 of chip 20, polymer tape 24 is bent 180° and folded back under chip 20. A layer of dielectric adhesive 34 may be provided on the bottom side of polymer tape 24 to secure polymer tape 24 to chip 20.

Ball pads 28 located on the ends of conductors 26 which are now located beneath semiconductor die 20 are electrically connected to bond pads 42 of a substrate 40 by conductive solder balls 38. Conductive solder balls 38 may be provided on ball pads 28, or alternatively conductive solder balls 38 may be provided on bond pads 42 of substrate 40.

Alternatively, the ball pads 28 of conductors 26 may be electrically connected to bond pads 42 of substrate 40 utilizing an isotropic or anisotropic conductive polymer bonding technique or a tab compression bond technique as are known in the art.

Optionally, a dielectric adhesive 44 may also be used on the top surface of polymer tape 24, which will be facing downward after polymer tape 24 is folded back under chip 20, to provide additional securement of semiconductor die 20 to substrate 40 along with the electrical connections of ball pads 28 of conductors 26 to bond pads 42 of substrate 40. Typically, a lower temperature thermoset adhesive is used to secure the polymer tape 24 to substrate 40, while a higher temperature thermoplastic or other adhesive is used to secure the polymer tape 24 to chip 20. The use of different temperature adhesives allows the chip 20 to be removed from substrate 40 by the application of heat of a specified temperature, while maintaining the integrity of the adhesive between the polymer tape 24 and chip 20 since the temperature necessary to release the bond between the polymer tape 24 and substrate 40 is less than the temperature necessary to release the bond between the polymer tape 24 and chip 20.

At least a portion of chip 20 may be encapsulated with an encapsulant 50, utilizing methods as are commonly known in the art, for additional protection of the chip and protection and securement of the electrical connections.

The use of polymer tape 24 to interconnect chip 20 with substrate 40 significantly reduces the likelihood of failure of the electrical bonds caused by differing amounts of thermal expansion and contraction of the chip 20 and substrate 40. The flexibility of the polymer tape 24 allows relative movement of the chip 20 with respect to the substrate 40 without applying any stress to the electrical connections.

Additionally, by folding the polymer tape 24 back under the chip 20, the entire package is only minimally larger than the chip 20 itself, thus providing a very compact integrated circuit package.

Figure 2:
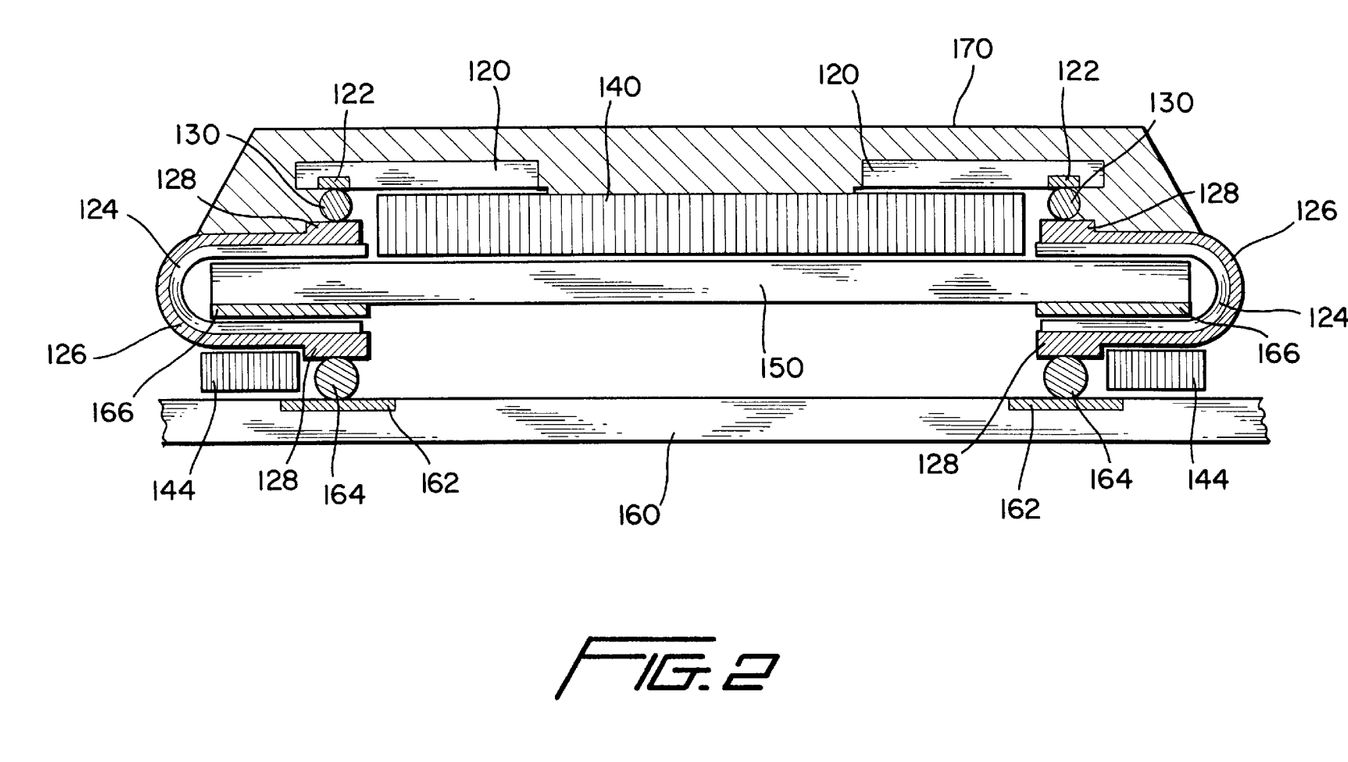
FIG. 2 illustrates a cross-sectional diagrammatic view of a multi-semiconductor package in accordance with the present invention.

FIG. 2 illustrates a cross-sectional view of a multi-semiconductor package in accordance with the present invention.

A pair of semiconductor die or chips 120 are provided with a plurality of bonding or bond pads 122 located substantially on one side of a first surface. The number and arrangement of the bond pads 122 depends on the circuit requirements of the chip 120, including input/output (I/O), power and ground connections. The bond pads may be provided in a single row along the edge of chip 120 as illustrated or alternatively may be provided in a plurality of rows or some other suitable arrangement.

A flexible polymer tape or interconnect 124 is provided with a plurality of thin layers of metallic material forming conductors 126 on one side. Polymer tape 124 is generally in the order of 2–6 mils thick, but preferably closer to 2 mils thick to provide a good degree of flexibility. Conductors 126 terminate at each end in conductive ball pads or contacts 128.

Bond pads 122 of chips 120 are provided with conductive solder balls 130, or alternatively contacts 128 of conductors 126 may be provided with conductive solder balls 130. Bond pads 122 are electrically connected to contacts 128 through conductive solder balls 130 on each chip 120. Other materials such as gold or copper bumps can also be employed.

Alternatively, bond pads 122 of chips 120 may be electrically connected to contacts 128 of conductive traces 126 utilizing an isotropic of anisotropic conductive polymer bonding technique of a tab compression bond technique as are known in the art.

The assemblies including each chip 120 and attached polymer tapes 124 are mounted on a first support 140. Support 140 is typically formed of any polymeric or non-conductive material, such as a silicone layer. Support 140 may or may not have heatsink properties. Each chip 120 is placed on support 140 so the sides of the chips 120 upon which bond pads 122 are located overlap the edge of support 140 and the bond pads 122 face toward the top surface of support 140.

The assembly including chips 120 and support 140 is placed on a second support 150. Support 150 is typically formed of a piece of metal, in which case it will act as a heatsink and readily transfer heat, or it could be formed of a ceramic material it which case it exhibits no heatsink properties. Support 150 extends beyond the edges of support 140. Polymer tape 124 is bent back 180° and folded under the bottom of support 150. Optionally, a dielectric adhesive 166 may be used to secure polymer tape 124 to support 150.

The assembly including chips 120 with attached polymer tapes 124, support 140 and support 150 can be encapsulated with an encapsulated 170 or protected utilizing a glob top method or lead from type injection molding as are commonly known in the art.

The assembly can then be mounted on substrate 160, such as a printed wiring board or the like. Substrate 160 is provided with conductive traces which terminate in ball pads 62. Ball pads 162 are provided with conductive solder balls 164. Other types of conductive balls such as gold or copper can also be used. Alternatively, bond pads 128, now facing away from the bottom of support 150, can be provided with conductive solder balls 164. The bond pads 128 are electrically connected to ball pads 162 through the conductive solder balls 164. Alternatively, bond pads 128 may be electrically connected to ball pads 162 utilizing an isotropic or anisotropic conductive polymer bonding technique or a tab compression bond technique as are known in the art. Substrate 160 provides the interconnection of chips 120 to the end-product circuitry.

Optionally, a dielectric adhesive 144 may also be used on the top surface of polymer tape 124, which will be facing downward after polymer tape 124 is folded back under support 150, to provide additional securement of semiconductor dies 120 and support 150 to substrate 160 along with the electrical connections of ball pads 128 of conductors 126 to bond pads of substrate 160. Typically, a lower temperature thermoset adhesive is used to secure the polymer tape 124 to substrate 160, while a higher temperature thermoplastic or other adhesive is used to secure the polymer tape 124 to support 150. The use of different temperature adhesives allows the assembly including chips 120, support 140 and support 150 to be removed from substrate 160 by the application of heat of a specified temperature, while maintaining the integrity of the adhesive between the polymer tape 124 and support 150 since the temperature necessary to release the bond between the polymer tape 124 and substrate 160 is less than the temperature necessary to release the bond between the polymer tape 124 and support 150.

Figure 3:
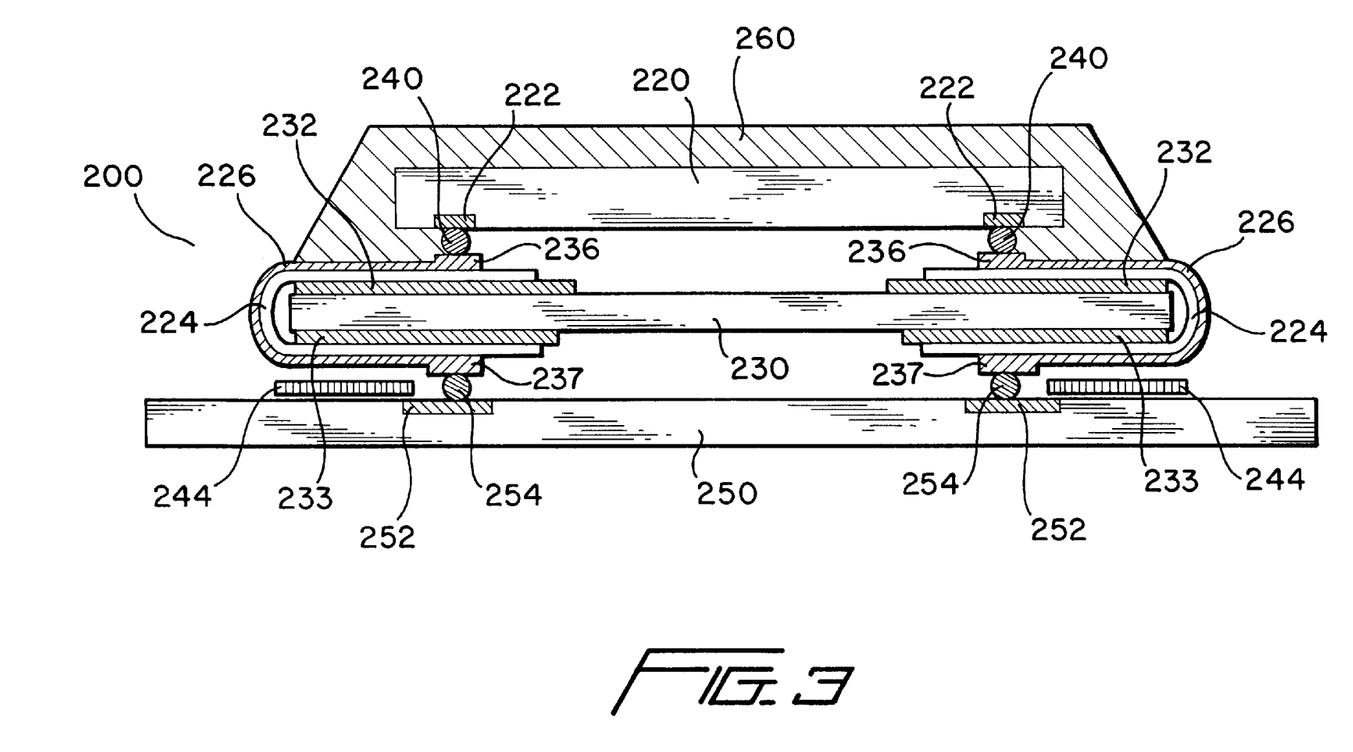
FIG. 3 illustrates a cross-sectional diagrammatic view of a semiconductor die mounted in accordance with a third embodiment of the present invention.

FIG. 3 illustrates a cross-sectional view of a semiconductor package 200 in accordance with another embodiment of the present invention. Semiconductor package 200 consists of semiconductor die or chip 220, which has a plurality of bonding or bond pads 222 on a first surface. The number and arrangement of the bond pads 222 depend upon the circuit requirements of the chip 220, including input/output (I/O), power and ground connections. The bond pads 222 may be provided in a single row on opposing sides of chip 220, in a plurality of rows on opposing sides, or in any other arrangement.

A flexible polymer tape or interconnect 224 is provided with a plurality of thin layers of metallic material forming conductive traces 226 on a first side. Polymer tape 224 is generally in the range of 2–6 mils thick, but preferably closer to 2 mils to provide a good degree of flexibility. Polymer tape 224 is secured to opposing sides of the top surface of a support 230, utilizing a dielectric adhesive 232, so the conductive traces 226 face away from support 230. Each polymer tape 224 is bent 180° back under the bottom side of support 230 and secured by dielectric adhesive 233. Support 230 can be formed of a material having heatsink properties, such as a metal or boron nitride loaded silicon, or could be formed of a material without any heatsink properties such as ceramic.

Alternatively, a single continuous piece of polymer tape 224 which is secured around substantially the entire perimeter of support 230, with a gap occurring approximately in the center of the top side of support 230, can be used instead of multiple pieces of polymer tape 224 as illustrated.

Conductive traces 226 on polymer tape 224 terminate in bond pads 236 on the top surface of support 230 and in bond pads 237 on the bottom surface of support 230. Bond pads 236 correspond in number and position to bond pads 222 of chip 220. Conductive solder balls 240 are provided on bond pads 222, or alternatively may be provided on bond pads 236. Outer types of conductive balls such as gold or copper can also be used. Bond pads 236 on polymer tape 224 are electrically connected to bond pads 222 of chip 220 through the conductive solder balls 240. Alternatively, bond pads 222 may be electrically connected to bond pads 236 utilizing an isotropic or anisotropic conductive polymer bonding technique or a tab compression bond technique as are known in the art.

The assembly including semiconductor die 230 and support 230 may be encapsulated or protected with an encapsulant 260 utilizing a glob top method or lead frame type injection molding as are commonly known in the art.

The assembly including semiconductor die 220 and support 230 is next bonded to substrate 250, such as a printed wiring board or the like. Substrate 250 is provided with conductive traces which terminate in ball pads 252. Ball pads 252 are provided with conductive solder balls 254, or alternatively bond pads 237 of conductive traces 226 are provided with conductive solder balls 254. Other types of conductive balls such as gold or copper can also be used. The ball pads 252 correspond in number and location to bond pads 237. Ball pads 252 of substrate 250 are electrically connected to the bond pads 237 of the polymer tape 224 by the conductive solder balls 254. Alternatively, bond pads 237 may be electrically connected to ball pads 252 of substrate 250 utilizing an isotropic or anisotropic polymer bonding technique or a tab compression bond technique as are known in the art.

Substrate 250 may have provisions for allowing several chips 220 to be mounted on it in the above described manner.

Optionally, a dielectric adhesive 244 may also be used on the top surface of polymer tape 224, which will be facing downward after polymer tape 224 is folded back under support 230, to provide additional securement of the assembly including semiconductor die 220 to substrate 250 along with the electrical connections of ball pads 237 of conductors 226 to bond pads 252 of substrate 250. Typically, a lower temperature thermoset adhesive is used to secure the polymer tape 224 to substrate 250, while a higher temperature thermoplastic or other adhesive is used to secure the polymer tape 224 to support 230. The use of different temperature adhesives allows the assembly including chip 220 and support 230 to be removed from substrate 250 by the application of heat of a specified temperature, while maintaining the integrity of the adhesive between the polymer tape 224 and support 230 since the temperature necessary to release the bond between the polymer tape 224 and substrate 250 is less than the temperature necessary to release the bond between the polymer tape 224 and support 230. It should be noted that underfill can be used it desired with this or other alternate embodiments shown in FIGS. 1 and 2.

Figure 4:
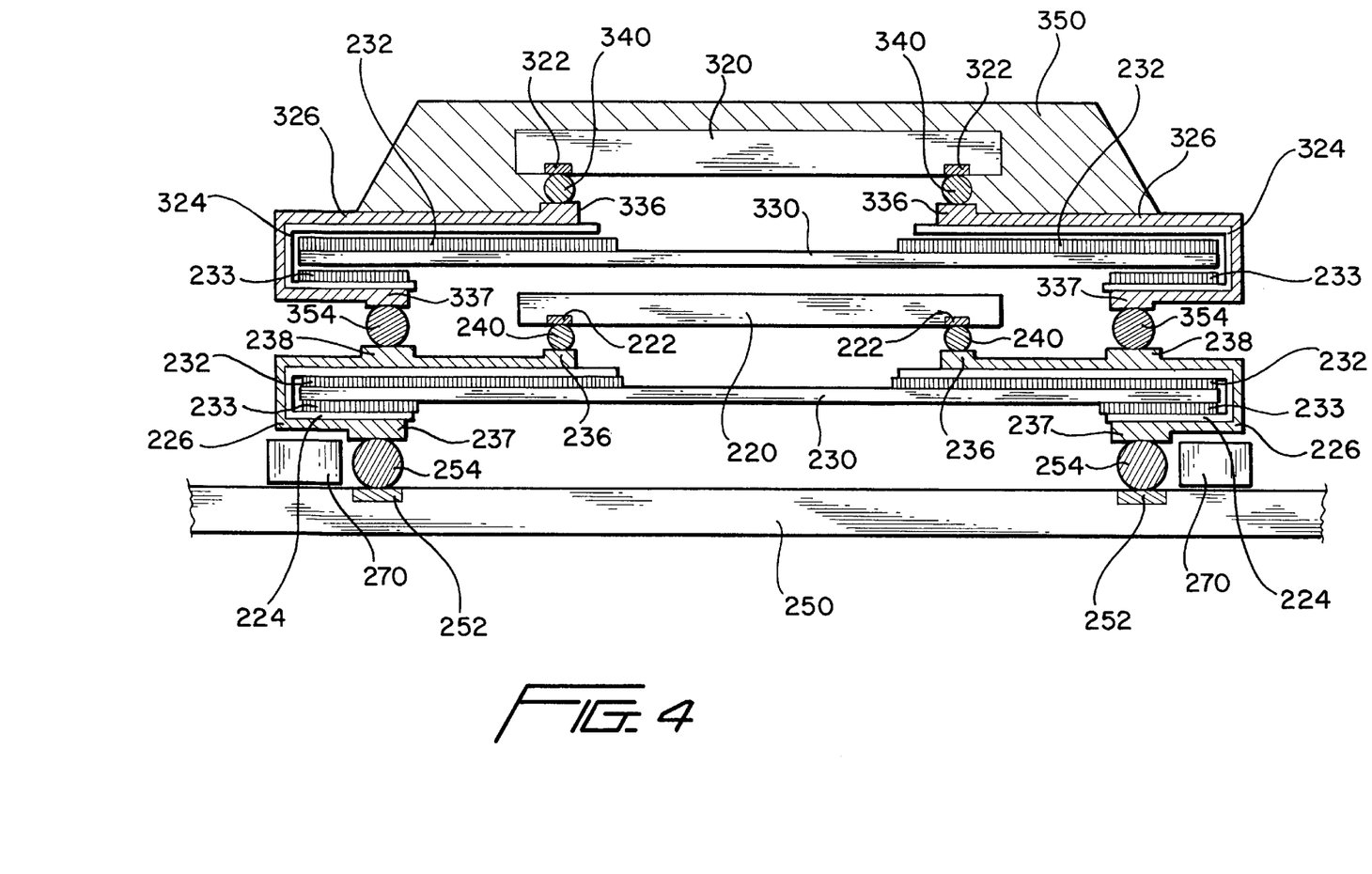
FIG. 4 illustrates a cross-sectional view of a multi-semiconductor package utilizing the mounting construction of the third embodiment of the present invention.

FIG. 4 illustrates a cross-sectional view of a multi-level semiconductor package which utilizes the construction described in reference to FIG. 3. In FIG. 4 like items to those in FIG. 3 are referred to by like numbers. Other embodiments can also be stacked.

A first semiconductor die or chip 220 is secured to a support 230 utilizing polymer tape 224 and dielectric adhesives 232, 233 substantially as hereinbefore described with reference to FIG. 3. Conductive traces 226 include a further plurality of bond pads 238 located adjacent to chip 220. Bond pads 238 are connected to the same or different conductors 226 than bond pads 236 are connected to.

A second semiconductor chip or die 320 is also provided. Chip 320 has a plurality of bonding or bond pads 322 on a first surface. The bond pads 322 may be provided in a single row on opposing sides of the bottom of the chip 320 as illustrated, in a plurality of rows on opposing sides of the chip 320, or any other arrangement.

A flexible polymer tape or interconnect 324 is provided with a plurality of thin layers of metallic material forming conductive traces 326 on a first side. Polymer tape 324 is generally in the range of 2–6 mils thick, but preferably closer to 2 mils to provide a good degree of flexibility. Polymer tape 324 is secured to opposing sides of the top surface of a support 330, utilizing a dielectric adhesive 232, so the conductive traces 326 face away from support 330. Each polymer tape 324 is bent 180° back under the bottom side of support 330 and secured by dielectric adhesive 233. Support 330 can be formed of a material having heatsink properties, such as a metal or boron nitride loaded silicone, or could be formed of a material without any heatsink properties such as ceramic.

Conductive traces 326 on polymer tape 324 terminate in bond pads 336 on the top surface of support 330 and in bond pads 337 on the bottom surface of support 330. Bond pads 336 correspond in number and position to bond pads 322 of chip 320. Conductive solder balls 340 are provided on bond pads 322, or alternatively may be provided on bond pads 336. Other types of conductive balls such as gold or copper can also be used. Bond pads 336 on polymer tape 324 are electrically connected to bond pads 322 of chip 320 through the conductive solder balls 340. Alternatively, bond pads 336 on polymer tape 324 may be electrically connected to bond pads 322 of chip 320 utilizing an isotropic or anisotropic conductive polymer bonding technique or a tab compression bond technique as are known in the art.

The assembly including chip 330 is stacked on top of the assembly including chip 220. Bond pads 337 correspond in position and number to bond pads 238. Bond pads 337 are provided with conductive solder balls 354, or alternatively bond pads 238 are provided with conductive solder balls 354. Other types of conductive balls such as gold or copper can also be used. Bond pads 337 are electrically connected to ball pads 230 through the conductive solder balls 354. Alternatively, bond pads 337 may be electrically connected to ball pads 238 utilizing an isotropic or anisotropic polymer bonding technique or a tab compression bond technique as are known in the art.

The assembly including chip 220 and chip 320 can be encapsulated or protected by encapsulant 350 utilizing a glob top method or lead frame type injection molding as are commonly known in the art.

The assembly including chip 220 and chip 320 is next bonded to substrate 250, such as a printed wiring board or the like. Substrate 250 is provided with conductive traces which terminate in ball pads 252. Ball pads 252 are provided with conductive solder balls 254, or alternatively bond pads 337 of conductive traces 226 are provided with conductive solder balls 354. Other types of conductive balls such as gold or copper can also be used. The ball pads 252 correspond in number and location to bond pads 237. Ball pads 252 of substrate 250 are electrically connected to the bond pads 237 of the polymer tape 224 by the conductive solder balls 254. Alternatively, ball pads 252 of substrate 250 may be electrically connected to the bond pads 237 of polymer tape 224 utilizing an isotropic or anisotropic conductive polymer bonding technique or a tab compression bond technique as are known in the art.

Substrate 250 may have provisions for allowing several assemblies including chip 220 and chip 320 to be mounted on it in the above described manner.

Optionally, a dielectric adhesive 270 may also be used on the top surface of polymer tape 224, which will be facing downward after polymer tape 224 is folded back under support 230, to provide additional securement of the assembly including chip 220 and chip 320 to substrate 250 along with the electrical connections of ball pads 237 of conductors 226 to bond pads 252 of substrate 250. Typically, a lower temperature thermoset adhesive is used to secure the polymer tape 224 to substrate 250, while a higher temperature thermoplastic or other adhesive is used to secure the polymer tape 224 to support 230 and support 330. The use of different temperature adhesives allows the assembly including chip 220 and chip 320 to be removed from substrate 250 by the application of heat of a specified temperature, while maintaining the integrity of the adhesive between the polymer tape 224 and support 230 and support 330 since the temperature necessary to release the bond between the polymer tape 224 and substrate 250 is less than the temperature necessary to release the bond between the polymer tape 224 and supports 230, 330.

The multi-level assembly including chip 220 and chip 320 provides a very compact integrated circuit package. The stacking provides a method to allow for multi-level semiconductor packaging which occupies a space on the substrate only slightly larger than the size of a single chip. Additionally, the distance between the chips is minimal, thus resulting in fewer propagation delays caused by excessive distances signals must pass in traveling from chip to chip. Furthermore, the use of the polymer tapes 224 and 324 and supports 230 and 330 reduce the effect of stresses on the electrical connections caused by thermal expansion and contraction of the chips and substrate.

Figure 5:
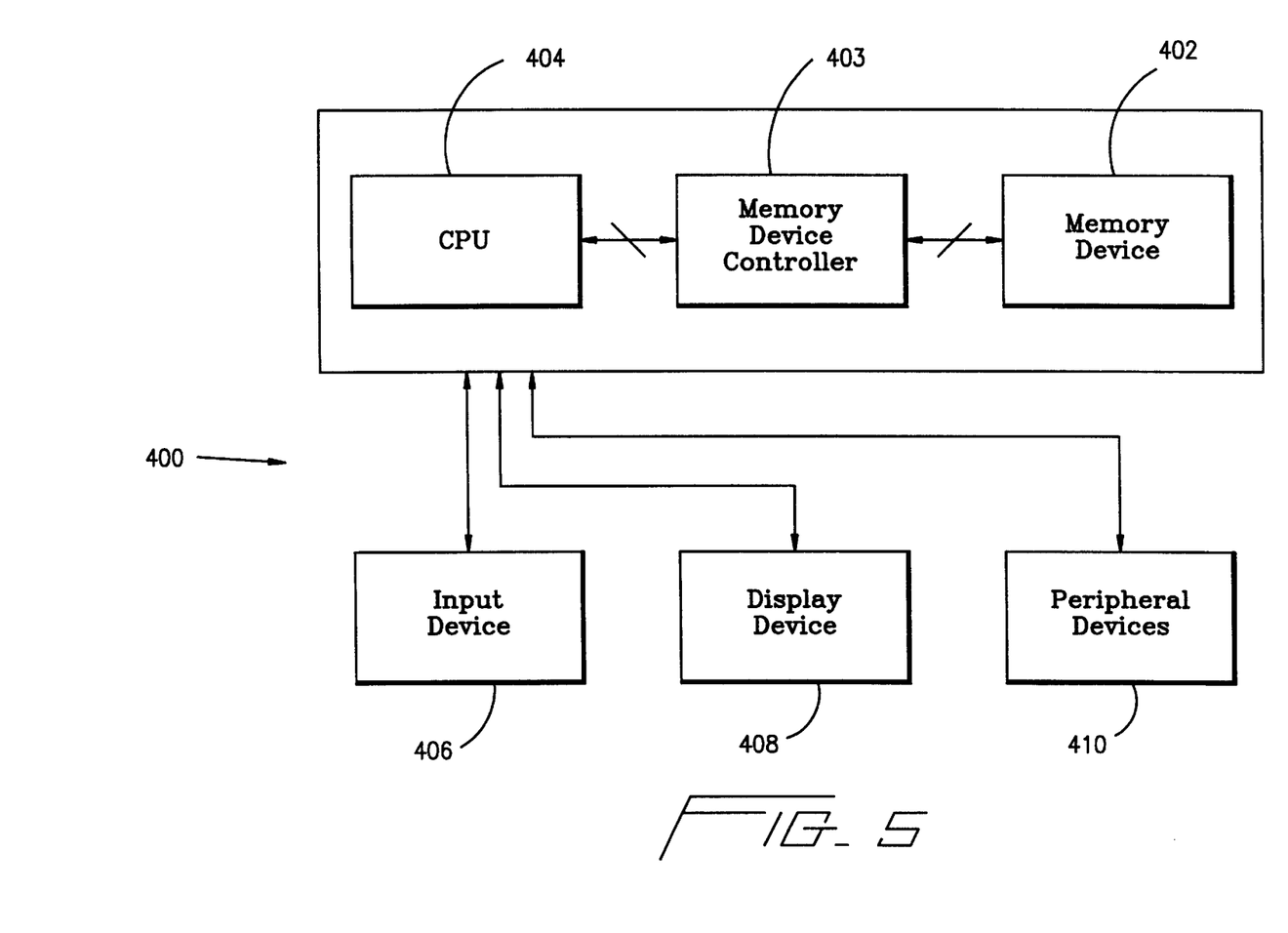
FIG. 5 is a block diagram of a typical processor controlled system in which the present invention would be used.

A typical processor system which includes integrated circuits, such as memory devices, that contain semiconductor packages according to the present invention, is illustrated generally at 400 in FIG. 5 in block diagram form. A computer system is exemplary of a device having integrated circuits such as memory devices. Most conventional computers include memory devices permitting the storage of significant amounts of data. The data is accessed during operation of the computers. Other types of dedicated processing systems, e.g. radio systems, television systems, GPS receiver systems, telephones and telephone systems also contain integrated circuit devices which can utilize the present invention.

A processor system, such as a computer system, generally comprises a memory device 402, such as a DRAM or SDRAM memory module, a memory device controller 403, a central processing unit (CPU) 404, input devices 406, display devices 400, and/or peripheral devices 410. It should be noted that a system may or may not include some or all of the aforementioned devices, and may or may not include multiple devices of the same type.

Memory device 402 and CPU 404 include integrated circuits which contain semiconductor packages according to the present invention hereinbefore described with reference to FIGS. 1–4. The use of semiconductor packages according to the present invention reduces the size and cost of the integrated circuits, effectively reducing the size and cost of the end product processor system. Additionally, the reduction of propagation delays of signals between the chips will provide increased operational speed. Furthermore, the use of semiconductor packages according to the present invention reduces the risk of malfunction of a processor due to damaged first level chip connections caused by thermal expansion and contraction.

Reference has been made to preferred embodiments in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be detected by Letters Patent of the U.S. is:

1. A method for mounting a semiconductor chip having a plurality of bond pads comprising the steps of:
    attaching a first surface of said semiconductor chip to a first end of at least one piece of a polymer tape which has a plurality of conductors on one surface, such that said conductors face away from said chip;
    connecting at least a portion of said plurality of bond pads to said plurality of conductors on said plurality of pieces of polymer tape;
    folding said plurality of pieces of polymer tape around and back under said semiconductor chip;
    using a first adhesive to secure a second end of said plurality of pieces of polymer tape to a second surface of said semiconductor chip opposite of said first surface such that said plurality of conductors face away from said second surface;
    placing said semiconductor which with at least one piece of polymer tape attached on a substrate;
    using a second adhesive to secure said at least one piece of polymer tape to said substrate; and
    connecting said at least a portion of said plurality of conductors facing away from said second surface to conductors on said substrate,
    wherein said second adhesive has a lower adhesion release temperature than said first adhesive.

2. The method for mounting a semiconductor chip according to claim 1 further comprising the step of:

encapsulating a least a portion of said semiconductor chip.

3. A method for fabricating a semiconductor package comprising the steps of:
    securing a plurality of semiconductor dies, each having a plurality of bond pads, to at least one piece of a flexible interconnect each having a plurality of conductors;
    connecting at least a portion of said bond pads of said plurality of semiconductor die to a respective portion of said plurality of conductors on said at least one piece of a flexible interconnect;
    mounting said plurality of semiconductor die on a first support piece;
    mounting said first support piece on a top surface of a second support piece;
    folding said at least one piece of a flexible interconnect back under said second support piece and securing, with a first adhesive, said at least one piece of a flexible interconnect to a bottom surface of said second support piece; and
    using a second adhesive to secure said at least one piece of a flexible interconnect to a substrate;
    wherein said second adhesive has a lower adhesion release temperature than said first adhesive.

4. A method for mounting a semiconductor die having a plurality of bond pads to a substrate, said method comprising the steps of:
    attaching a plurality of pieces of polymer tape having a plurality of conductors thereon to said semiconductor die;
    connecting at least a portion of said plurality of bond pads to a respective portion of said plurality of conductors;
    attaching said semiconductor die, with said plurality of pieces of polymer tape attached, to a top surface of a support;
    folding said plurality of pieces of polymer tape back under said support;
    attaching said plurality of pieces of polymer tape to a bottom surface of said support with a first adhesive; and
    attaching said support to a substrate with a second adhesive,
    wherein said second adhesive has a lower adhesion release temperature than said first adhesive.

5. The method for mounting a semiconductor die according to claim 4 further comprising:
    encapsulating at least a portion of said semiconductor die and said support piece.

6. A method for stacking a plurality of semiconductor dies each having a plurality of bond pads comprising the steps of:
    connecting said plurality of bond pads of each of said plurality of semiconductor dies to at least a portion of a plurality of conductors on at least one of a plurality of pieces of a flexible interconnect;
    attaching each of said plurality of semiconductor dies, with said at least one of a plurality of pieces of a flexible interconnect secured thereon, to a top surface of a respective one of a plurality of supports with a first adhesive;
    folding said plurality of pieces of a flexible interconnect back under said respective one of said plurality of supports;
    attaching said plurality of pieces of a flexible interconnect folded back under said respective one of said plurality to a bottom surface of said respective support with said first adhesive;

mounting a first semiconductor die with attached respective support on top of a second semiconductor die with attached respective support;

connecting said plurality of conductors of said plurality of pieces of a flexible interconnect mounted to said respective support of said first semiconductor die to said plurality of conductors of pieces of a flexible interconnect mounted to said respective support of said second semiconductor die; and securing said at least one of said plurality of pieces of a flexible interconnect folded back under said respective support of said second semiconductor die to a substrate using a second adhesive, wherein said second adhesive has a lower adhesion release temperature than said first adhesive.

7. The method for stacking a plurality of semiconductor die according to claim 6 further comprising the step of:

encapsulating at least a portion of said plurality of semiconductor die.

* * * * *

UNITED STATES PATENT AND TRADEMARK OFFICE
CERTIFICATE OF CORRECTION

PATENT NO. : 6,165,817
DATED : December 26, 2000
INVENTOR(S) : S. Akram et al.

It is certified that error appears in the above-identified patent and that said Letters Patent is hereby corrected as shown below:

Specification,
Abstract,
Line 8, delete "electrically" and substitute -- electrical --.

Column 5,
Line 12, after "chip", delete "30" and substitute -- 20 --.

Column 7,
Line 22, after "lead", delete "from" and substitute -- frame --.
Line 44, after "material", insert -- 162 --.

Column 8,
Line 34, after "die", delete "230" and substitute -- 220 --.

Column 9,
Line 9, after "used", delete "it" and substitute -- if --.
Line 65, after "pads", delete "230" and substitute -- 238 --.

Column 11,
Line 10, after "display devices", delete "400" and substitute -- 410 --.

Claims,
Column 13,
Line 1, before "to a botom surface" insert -- of supports --.

Signed and Sealed this

Second Day of October, 2001

Attest:

*Attesting Officer*

NICHOLAS P. GODICI
*Acting Director of the United States Patent and Trademark Office*